United States Patent [19]

Ohashi et al.

[11] Patent Number: 5,016,803
[45] Date of Patent: May 21, 1991

[54] WIRE BONDING APPARATUS

[75] Inventors: Yuji Ohashi; Yoshimitsu Terakado; Hijiri Hayashi, all of Tokyo, Japan

[73] Assignee: Kabushiki Kaisha Shinkawa, Tokyo, Japan

[21] Appl. No.: 429,760

[22] Filed: Oct. 31, 1989

[30] Foreign Application Priority Data

Nov. 1, 1988 [JP] Japan ................................. 63-274553

[51] Int. Cl.$^5$ ...................... H05K 3/32; H01L 21/60; B23K 20/26
[52] U.S. Cl. ......................................... 228/4.5; 228/9; 228/104
[58] Field of Search .................... 228/4.5, 11, 8–10, 228/1.1, 110, 179, 103, 904, 41, 104

[56] References Cited

U.S. PATENT DOCUMENTS

| 4,019,669 | 4/1977 | Tanimoto et al. | 228/4.5 |
| 4,210,270 | 7/1980 | Garner | 228/103 |
| 4,598,853 | 7/1986 | Hill | 228/10 |
| 4,817,848 | 4/1989 | Gabaldon | 228/1.1 |
| 4,854,494 | 8/1989 | von Raben | 228/103 |
| 4,909,431 | 3/1990 | Japachino et al. | 228/103 |

FOREIGN PATENT DOCUMENTS

| 72049 | 5/1980 | Japan | 228/4.5 |
| 206039 | 12/1982 | Japan | 228/4.5 |
| 84535 | 5/1984 | Japan | 228/4.5 |
| 154535 | 8/1985 | Japan | 228/4.5 |
| 73530 | 4/1988 | Japan | 228/4.5 |

Primary Examiner—Sam Heinrich
Attorney, Agent, or Firm—Koda and Androlia

[57] ABSTRACT

A wire bonding apparatus in which an air guide blows air against a bonding wire so that tension is applied to the bonding wire between a wire spool and a bonding tool so that the bonding wire comes in contact with a wire-contact. An optical sensor is provided near the wire-contact so that the sensor is prevented from contacting the bonding wire. Thus, the presence of the bonding wire is detected by the optical sensor which senses when the bonding wire is in contact with the wire-contact.

3 Claims, 6 Drawing Sheets

TO SPOOL

TO BONDING TOOL

WIRE BONDING APPARATUS

BACKGROUND OF THE INVENTION

1. Field of the Invention

The present invention relates to a wire bonding apparatus, and more particularly to a wire bonding apparatus with a bonding wire detector which detects a wire supply, wire breakage, improper wire connection, wire supply depletion, presence or absence of wire at the start of bonding, etc.

2. Prior Art

In conventional wire bonding apparatus disclosed for example in Japanese Patent Application Laid-Open No. 59-115533, an air guide is provided between a spool on which the bonding wire is wound and a bonding tool. The air guide blows air against the bonding wire so that tension is applied to the wire. A detection plate faces the direction that the air so that it contacts the bonding wire. Accordingly, the condition of the bonding wire is detected by determining whether or not the bonding wire is in contact with the detection plate. In other words, the condition of the bonding wire is ascertained in relation to whether or not an electrical current flows through the detection plate and to the bonding wire.

Thus, in the above described prior art, contact of the bonding wire with the detection plate is ascertained by determining whether or not an electrical current flows through the bonding wire. Accordingly, when the detection plate is soiled or when minute dust particles adhere to the bonding wire, it is impossible to accurately detect if the bonding wire is in contact with the detection plate. This causes operation error to occur.

More specifically, improper or proper detection of the wire supply is usually performed after completion of the second bonding step. The bonding wire is supplied by a motor which drives the spool until the wire contacts the detection plate. Accordingly, if electrical continuity does not exist between the detection plate and the bonding wire, even though the wire on the spool is in physical contact with the detection plate, the apparatus will erroneously indicate that the wire supply is improper, and wire will be excessively supplied resulting in slack. If, however, wire abnormalities such as wire breakage, improper wire connection or depletion of the wire supply, etc., are erroneously detected despite the fact that the bonding process is actually proceeding normally, the apparatus will stop.

SUMMARY OF THE INVENTION

Accordingly, the object of the present invention is to provide a wire bonding apparatus which can prevent erroneous detection of the condition of the wire.

The abovementioned object of the present invention is accomplished by a combination of a wire-contact and a light (optical) sensor. The wire-contact faces the direction that the air blows in so that the bonding wire come into contact with the wire-contact when the wire is blown by the air. The light sensor, which detects the bonding wire contacted with the wire-contact, is provided near the wire-contact so that it does not contact the bonding wire.

With such a structure, normal operation and abnormal operations are detected by determining whether or not the bonding wire is in contact with the surface of the wire-contact during the bonding process. More specifically, if the operation of the apparatus is normal when the bonding wire is in contact with the wire-contact, then the bonding operation is determined to be abnormal when the wire is not in contact with the wire-contact. Conversely, if the operation of the apparatus is normal when the wire is separated from the wire-contact, then the operation is determined abnormal when the bonding wire is in contact with the wire-contact.

In the present invention, contact between the bonding wire and the wire-contact is not directly detected via electrical continuity between these two elements. Instead, contact is detected by a light sensor which itself does not contact the bonding wire.

BRIEF DESCRIPTION OF THE DRAWINGS

FIGS. 5(a) and 5(b) show essential sections of the apparatus, wherein FIG. 5(a) is a perspective view and FIG. 5(b) is a side view;

FIGS. 8(a) and 8(b) illustrate a second embodiment of the present invention wherein FIG. 8(a) is a side view and FIG. 8(b) is an enlarged perspective view of an essential portion thereof.

DETAILED DESCRIPTION OF THE INVENTION

One embodiment of the present invention will be described with reference to FIGS. 1 through 5. Elements known in the prior art will be described first.

Figure 1:
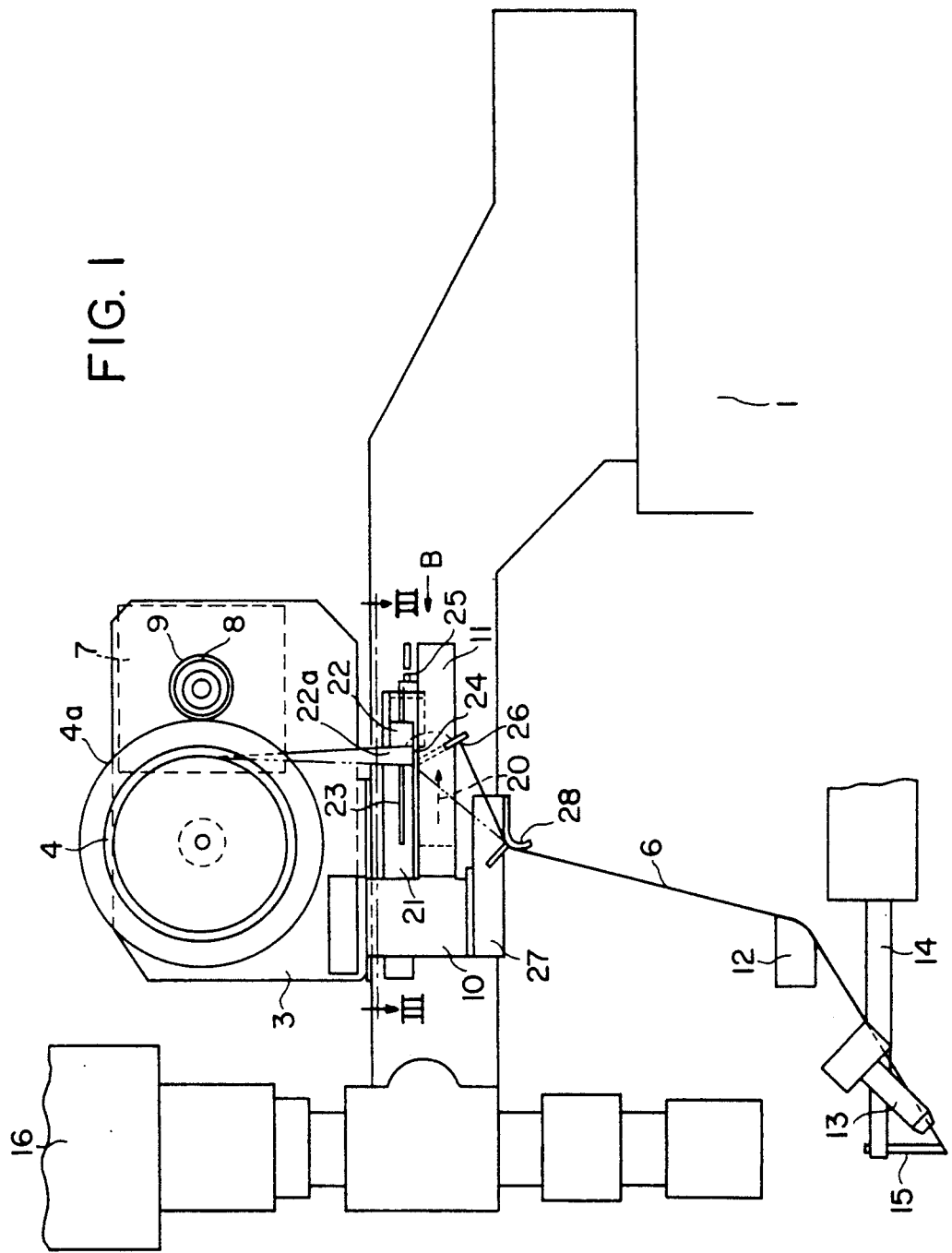
FIG. 1 is a side view of a first embodiment of the present invention.
Figure 2:
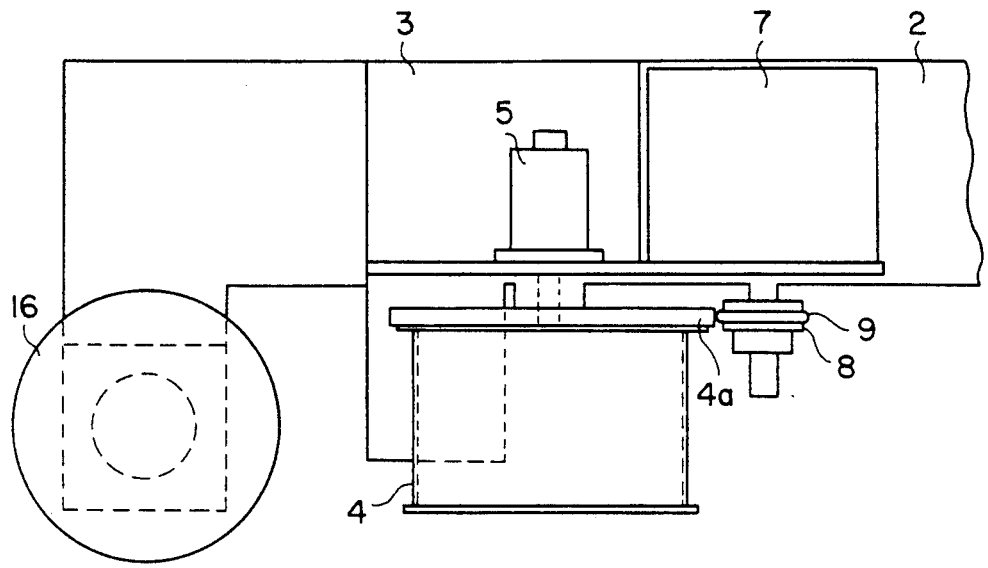
FIG. 2 is a plan view of a spool area shown in FIG. 1.
Figure 3:
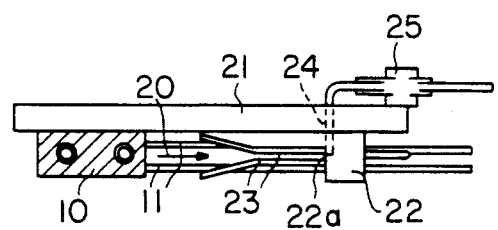
FIG. 3 is a section along line III—III of FIG. 1.
Figure 4:
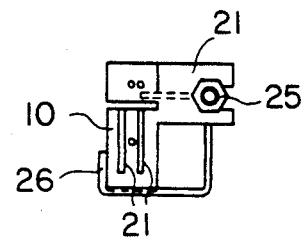
FIG. 4 is a rear view of the area indicated by arrow B in FIG. 1.

In FIGS. 1 and 2, a supporting block 2 is provided on a bonding head 1 which is driven in the X and Y directions by a driving means (not shown). A spool supporting plate 3 is mounted on this supporting block 2, and a spool 4 is rotatably held on the spool supporting plate 3 via a bearing 5. Bonding wire 6 is wound on the spool 4.

A motor 7 is provided on the spool supporting plate 3, and an O-ring 9 made of an elastic material is attached to a friction gear 8 which is fastened to an output shaft of the motor 7. The O-ring 9 is pressed against the rim 4a of the spool 4. Furthermore, an air guide supporting plate 10 is provided on the supporting block 2, and an air guide 11 is provided on the air guide supporting plate 10.

The bonding wire 6 reeled out of the spool 4 is extended via the air guide 11, wire guide 12 and clamper 13 to the lower end of a bonding tool 15 which is fastened at one end to a bonding arm 14. The other end of the bonding arm 14 is attached to the bonding head 1 so that the bonding arm 14 is free to move up and down or to pivot. The bonding arm 14 is driven by a vertical driving means (not shown). The wire guide 12 and clamper 13 are fastened to the bonding head 1. A camera 16 which detects the bonding surface is mounted on the supporting block 2. Since the above described structure is found in prior art, a further detailed description will be omitted.

A block mount 21 is provided on the air guide supporting plate 10. The block mount 21 is positioned above and to one side of the air guide 11 and extends in the direction of arrow 20 which indicates the direction that the air is blown in by the air guide 11. A wire-contact 22 is provided on the block mount 21 so that the wire-contact 22 is positioned above the air guide 11. Two guide pins 23 which are parallel to the wire guide 12 are provided on the wire contact surface 22a of the wire-contact 22 directly over the air guide 11.

Figure 5A:
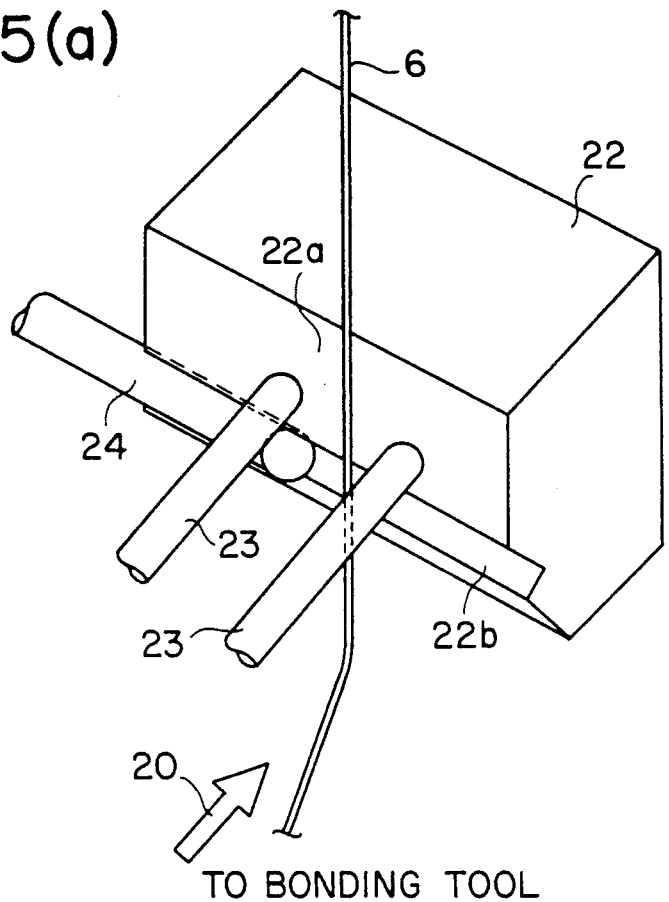
Figure 5B:
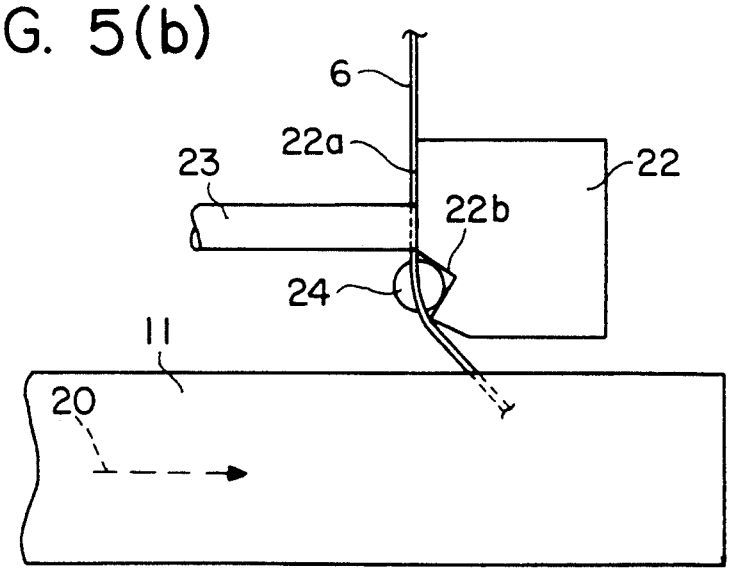

As best seen in FIGS. 5(a) and 5(b), the sensor fastening surface 22b is a V-shaped groove which is formed in the lower portion of the wire-contact surface 22a of the wire-contact 22. An optical fiber sensor 24 is provided in this sensor fastening surface 22b, i.e., in the V-shaped groove. The sensor 24 is provided so that the center of the optical axis thereof is more or less flush with the wire-contact surface 22a. The tip of the sensor 24 is prevented from protruding between the two guide pins 23. The optical fiber sensor 24 is fastened to the wire-contact 22 by a fastening means (not shown).

Returning to FIGS. 1, 3, and 4, an optical fiber unit 25 which holds the optical fiber sensor 24 is provided on the block mount 21. A stopper 26, which guides the bonding wire 6 extending downward from the air guide 11, is also provided on the block mount 21. A supporting plate 27 is attached to the lower surface of the air guide supporting plate 10, and a wire guide plate 28 which guides the wire 6 is fastened to this supporting plate 27.

The bonding wire 6 extending from the spool 4 to the wire guide 12 passes between the two guide pins 23 through the air guide 11 and over the wire guide plate 28. The detection circuit and method to control the motor 7 which drives the spool 4 is the same as the circuit and method found in conventional wire detection devices. When the bonding wire 6 blocks the optical fiber sensor 24, an "L" ("Low") signal is outputted to the detection circuit; when the wire 6 is not blocking the optical fiber sensor 24, an "H" ("High") signal is outputted to the detection circuit.

Next, operation of this embodiment will be described with reference to FIG. 6.

First, before bonding is started, the presence or absence of the bonding wire is detected. Specifically, the optical fiber sensor 24 determined whether or not the bonding wire 6 is properly in place so that the bonding wire 6 runs from the spool 4 to the bonding tool 15.

Figure 6A:
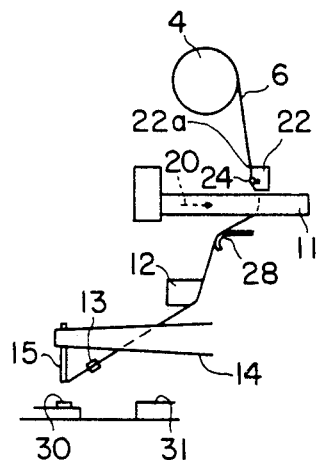
FIGS. 6(a) through 6(e) illustrate normal operation of the apparatus.

If the supply of the bonding wire 6 from the spool 4 is sufficient, then the wire 6 will contact the wire-contact surface 22a of the wire-contact 22 as a result of the tension applied by the air (shown by the arrow 20) which is blown by the air guide 11 (FIG. 6(a)). Under these conditions, the bonding wire 6 blocks the (light axis of the) optical fiber sensor 24; accordingly, the output of the optical fiber sensor 24 is "L", which indicates normal operation. If the bonding wire 6 is not blocking the (light axis of the) optical fiber sensor 24, a wire abnormality will be indicated, e.g., "NO WIRE" (showing that the bonding wire 6 is not set), is displayed, and the apparatus is not actuated.

Figure 6B:
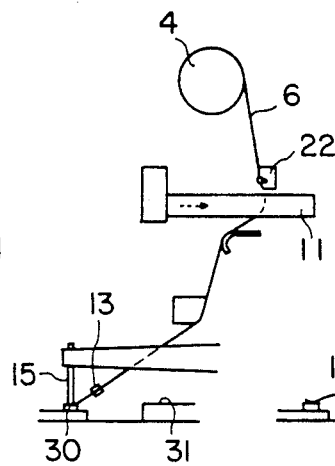

If it is determined as a result of the wire detection that there is no wire abnormality, the bonding tool 15 is moved above a first bonding point 30 and lowered onto the first bonding point 30, and the first bonding point 30 is bonded (FIGS. 6(a) and 6(b)).

The clamper 13 then opens and the bonding tool 15 is raised. The bonding tool 15 is moved and lowered to a second bonding point 31, and it is bonded (FIG. 6(c)). At this time, whether or not the bonding wire 6 is blocking the optical fiber sensor 24 is checked. If the bonding wire 6 is not blocking the optical fiber sensor 24, the apparatus will display, "Wire Connection Failure or Wire Breakage," which is an indication of a wire abnormality, after the completion of the second bonding operation, and thus the apparatus is stopped. When the apparatus is stopped, the following may occur.

Figure 6C:
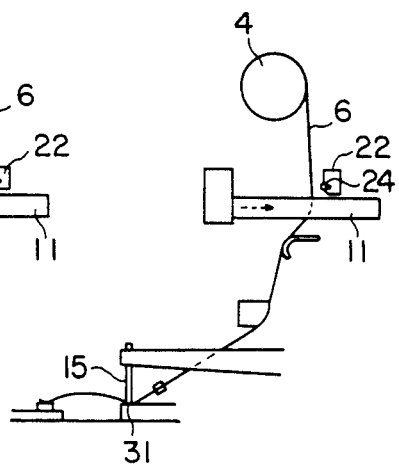

The first case that may occur is illustrated in FIG. 6(c). Specifically, this is a state in which a certain amount of bonding wire 6 forms a wire loop in the operation illustrated in FIG. 6(b) and 6(c). Thus, the bonding wire 6 does not block the optical fiber sensor 24 (FIG. 6(c)).

Figure 7A:
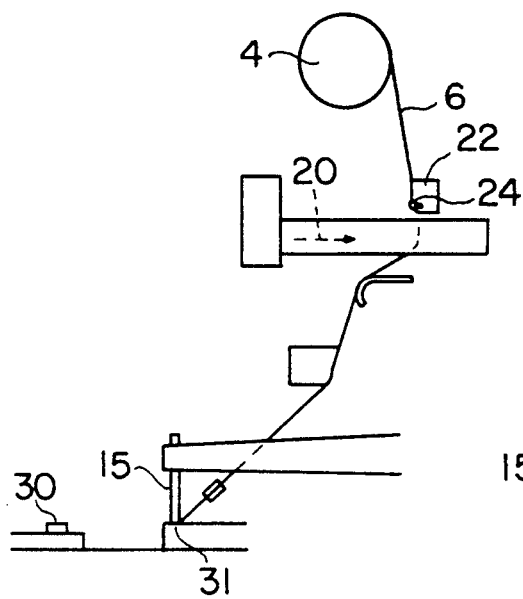
FIGS. 7(a) through 7(c) illustrate abnormal operation of the apparatus.

The second case is illustrated in FIG. 7(a). If the bonding is not performed at the first bonding point 30, no wire 6 is consumed. As a result, the bonding wire 6 blocks the optical fiber sensor 24 as shown in FIG. 7(a).

Figure 7B:
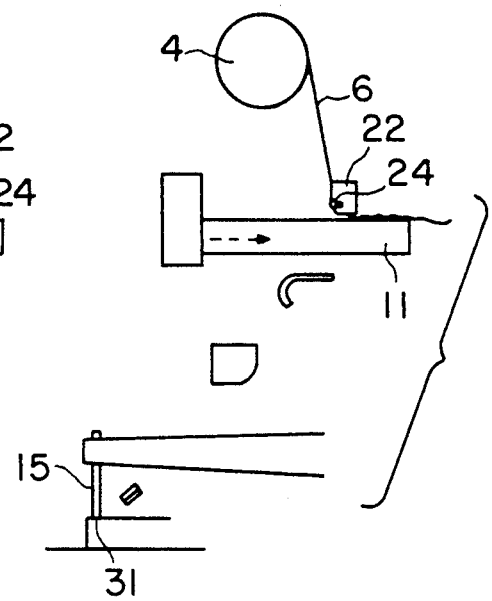

The third case illustrated in FIG. 7(b) is where the bonding wire 6 breaks and slips out of the boding tool 15. As a result, the bonding wire 6 is blown upward by the air from the air guide 11, and the wire 6 blocks the optical fiber sensor 24 as shown in FIG. 7(b).

Of the above-described three cases, only the first state is a normal operating state; while the second and third states are abnormal states.

Figure 6D:
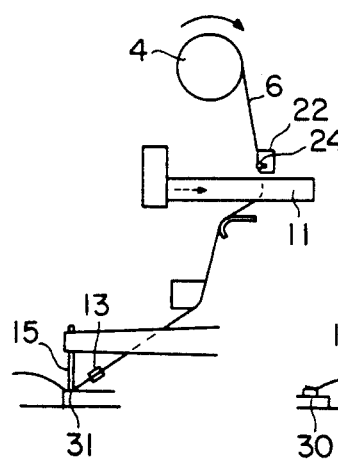

If there is no wire connection failure or wire breakage, the motor 7 runs after completion of the second bonding operation so that the bonding wire 6 is further reeled out of the spool 4 until the bonding wire 6 again blocks the optical fiber sensor 24 as shown in FIG. 6(d). In this case, when the wire supply action of the spool 4 continues even after the bonding wire 6 on the spool 4 is all used up (in other words, if there is not even a single turn of bonding wire 6 left on the spool 4), the bonding wire 6 does not block the optical fiber sensor 24 (FIG. 7(c)). Accordingly, the motor 7 is caused to turn for a fixed period of time, and whether or not the wire 6 is blocking the optical fiber sensor 24 is checked.

Figure 6E:
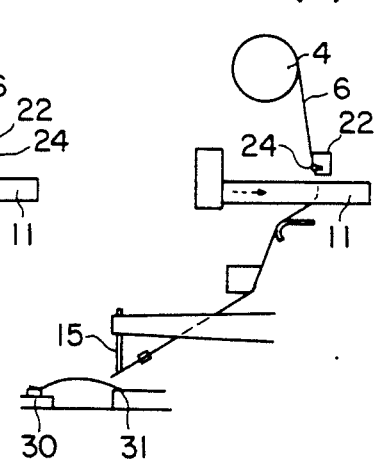

When bonding action of the second bonding point 31 is completed, the motor 7 is turned, and the clamper 13 is closed and raised so that the bonding wire 6 is cut near the second bonding point 31. Following this cutting, the bonding tool 15 is raised and the bonding wire 6 is played out slightly beyond the tip of the bonding tool 15 by the clamper 13 as shown in FIG. 6(e).

Figure 7C:
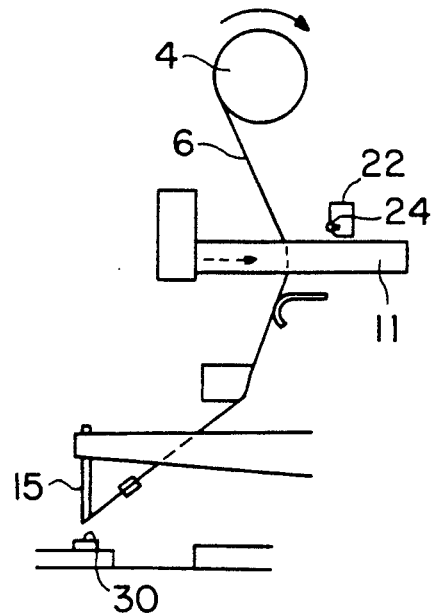

The bonding tool 15 is then moved to a point over the first bonding point 30 of the next bonding operation, and a check is made to ascertain whether or not the bonding wire 6 is blocking the optical fiber sensor 24. If the bonding wire 6 is blocking the optical fiber sensor 24, the operation is considered to be normal. If all the bonding wire 6 has been used and the optical fiber sensor 24 is not blocked by the bonding wire 6 as shown in FIG. 7(c), a "Wire Exhausted" message is displayed as an indication of abnormality, and the apparatus is stopped. Subsequent wire detection in the bonding process is performed in a similar manner.

Since wire detection is performed by an optical fiber sensor (i.e., a light sensor) 24 which does not contact the bonding wire 6 (instead of relying on electrical continuity between the wire and a detection plate), improper wire supply, wire breakage, wire connection failures and depletion of the wire supply, etc., can be reliably and stably detected.

Figure 8A:
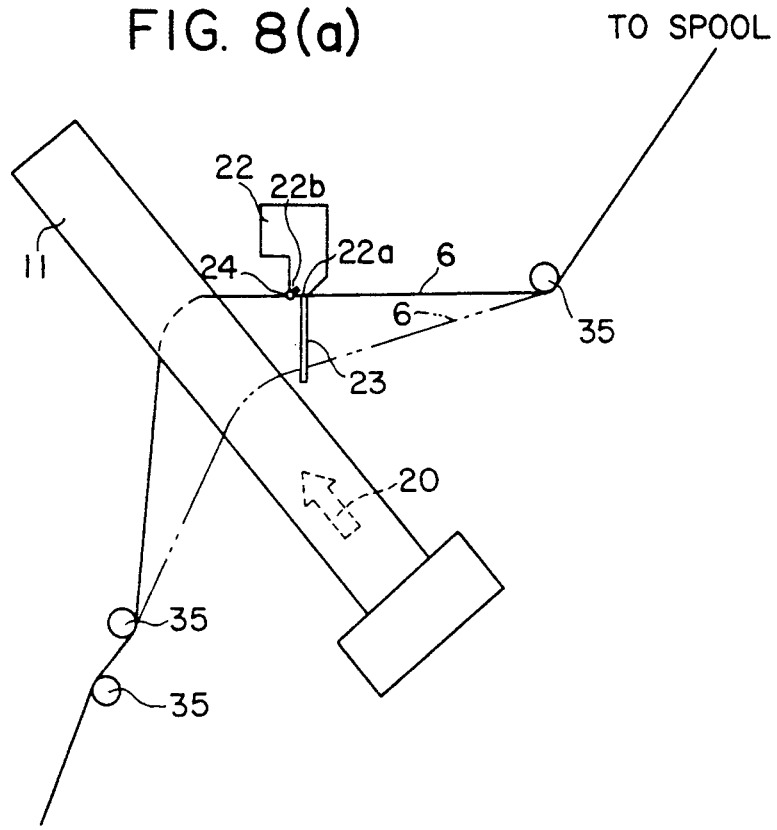
Figure 8B:
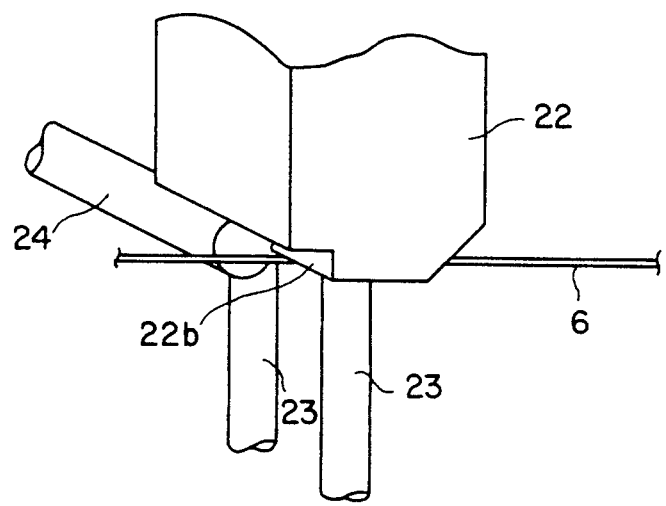

FIGS. 8(a) and 8(b) illustrate a second embodiment of the present invention. In the first embodiment, the air direction 20 is from left to right with respect to the Figures, and the wire-contact surface 22a of the wire-contact 22 is perpendicular to the air direction. In the second embodiment, the air is blown obliquely upward from right to left (as shown by the arrow 20), and the wire-contact surface 22a of the wire-contact piece 22 is provided horizontally. This arrangement provides the same effect as the first embodiment.

In FIG. 8(a), reference numeral 35 is a wire guide. The bonding wire 6 shown by the solid line indicates that the bonding wire 6 is sufficiently supplied so that the bonding wire 6 blocks the optical fiber sensor 24, while the two-dot chain line indicates that the bonding wire 6 is not blocking the optical fiber sensor 24.

The present invention is not limited to the two embodiments described above, and the air guide 11 and wire-contact 22 may be positioned in various ways. In the above embodiments, the optical fiber sensor 24, that is, the light sensor, is mounted on the wire-contact 22; however, it would be possible to mount the sensor 24 on the supporting block 2 or the block supporting plate 21. Furthermore, although it is desirable to position the optical fiber sensor 24 on the wire-contact surface 22a of the wire-contact 22, it would also be possible to provide the sensor 24 either above or below the wire-contact surface 22a of the wire-contact 22 (but still in close proximity to the wire-contact surface 22a). In addition, though in the embodiments, the bonding tool 15 is a wedge, it goes without saying that the bonding tool 15 could also be a capillary.

As is clear from the above description, the present invention accomplishes wire detection by means of a light or optical sensor which does not contact the bonding wire. Accordingly, improper wire supply, wire breakage, wire connection failures and depletion of the wire supply, etc., are reliably and stably detected.

We claim:

1. A wire bonding apparatus in which an air guide which blows air against a bonding wire so that tension is applied to said bonding wire is provided between a spool on which said bonding wire is wound and a bonding tool of said apparatus, wherein a wire-contact which is to be contacted by said bonding wire is installed to face a direction in which said air is blown by said air guide, and a light sensor is provided in close proximity to said wire-contact to detect said bonding wire without contacting said bonding wire when said bonding wire is in contact with said wire-contact and such that the center of optical axis of said light sensor is positioned on a wire-contact surface of said wire-contact whereby a wire abnormality is detected.

2. A wire bonding apparatus according to claim 1, wherein said light sensor is provided on said wire-contact.

3. A wire bonding apparatus in which an air guide which blows air against a bonding wire so that tension is applied to said bonding wire is provided between a spool on which said bonding wire is wound and a bonding tool of said apparatus, wherein a wire contact which is to be contacted by said bonding wire is installed to face a direction in which said air is blown by said air guide, and a light sensor is provided to detect said bonding wire without contacting said bonding wire when said bonding wire is in contact with said-contact, and wherein said light sensor is provided on said wire contact and wherein said light sensor is provided so as to contact a sensor fastening surface of a V-shaped groove formed on a wire-contact surface of said wire-contact.

* * * * *

UNITED STATES PATENT AND TRADEMARK OFFICE
CERTIFICATE OF CORRECTION

PATENT NO. : 5,016,803

DATED : May 21, 1991

INVENTOR(S) : YUJI OHASHI, et al.

It is certified that error appears in the above-identified patent and that said Letters Patent is hereby corrected as shown below:

On title page, in item [75], add --Tatsunari Mii--

Signed and Sealed this

Sixth Day of October, 1992

Attest:

DOUGLAS B. COMER

*Attesting Officer*         *Acting Commissioner of Patents and Trademarks*